United States Patent [19]

Altoz

[11] Patent Number: 4,635,709
[45] Date of Patent: Jan. 13, 1987

[54] DUAL MODE HEAT EXCHANGER

[75] Inventor: Frank E. Altoz, Catonsville, Md.

[73] Assignee: The United States of America as represented by the Secretary of the Air Force, Washington, D.C.

[21] Appl. No.: 804,193

[22] Filed: Dec. 3, 1985

[51] Int. Cl.⁴ ............... F28D 15/00; H01L 23/44
[52] U.S. Cl. .................. 165/32; 165/104.33; 165/911; 165/912; 165/44; 62/467; 361/383; 361/385
[58] Field of Search ............ 165/32, 911, 912, 104.33, 165/44; 62/514 R, 304, 119, 467; 361/385, 383

[56] References Cited

U.S. PATENT DOCUMENTS

| 3,390,541 | 7/1968 | Johnson et al. | 62/119 |
| 3,392,781 | 7/1968 | Zuber et al. | 165/133 |
| 3,560,778 | 2/1971 | Raye | 165/911 |
| 3,664,412 | 5/1972 | Zerkle | 62/304 |
| 3,734,168 | 5/1973 | De Groote | 165/11 |
| 3,776,305 | 12/1973 | Simmons | 165/107 |
| 4,106,557 | 8/1978 | Sonobe et al. | 165/1 |
| 4,335,781 | 6/1982 | Duffy | 165/1 |
| 4,495,988 | 1/1985 | Grossman | 165/96 |

FOREIGN PATENT DOCUMENTS 273219  8/1970  U.S.S.R. ............... 165/911

Primary Examiner—Albert W. Davis, Jr.
Attorney, Agent, or Firm—Jules J. Morris; Donald J. Singer

[57] ABSTRACT

A dual mode heat exchanger 10 for cooling airborne electronics 12 through a cold plate 14. The heat exchanger either radiates heat to air through radiator fins 18 or absorbs heat by evaporative cooling. A liquid coolant contained in grooves 16 of the cold plate 14 boils at a preselected temperature and thereby absorbs heat energy. Vapor released by the boiling liquid is exhausted through a hydrophobic filter membrane 24.

13 Claims, 4 Drawing Figures

4,635,709

DUAL MODE HEAT EXCHANGER

STATEMENT OF GOVERNMENT INTEREST

The invention described herein may be manufactured and used by or for the Government for governmental purposes without the payment of any royalty thereon.

TECHNICAL FIELD

This invention relates to heat transfer devices and is particulary suited for, although not limited to, dissipating heat generated by electronic equipment carried aboard aircraft.

BACKGROUND OF THE INVENTION

Typically electronic devices are cooled by means of passive natural radiation from an associated heat sink device, usually constructed of aluminum. Some high powered electronic devices, however, generate very large amounts of heat and cannot be adequately cooled by passively radiating heat sinks. For such devices specialized cold plates are provided which can absorb large amounts of excess heat and prevent overheating.

Cold plates are generally constructed of heat conducting metallic materials and are mounted adjacent to the heat producing components. A heat transporting or absorbing fluid is routed through heat transfer fins or passages within or adjacent to the cold plate so as to remove the excess heat generated by the heat producing components.

When heat producing electronic devices are carried aboard aircraft the heat absorbing fluid is generally air. Cool air is ducted past the cold plate from an external port which is exposed to air flowing past the aircraft, unfortunately, this does not always provide sufficent cooling. Inadequate cooling occurs when either there is insufficient cool air available to cool the cold plate or when high aircraft speeds result in a ram effect which heats the air passing over the aircraft surfaces so that the air is too warm for useful cooling.

Various devices have therefore been used to cool airborne electronics, an example of one can be found in U.S. Pat. No. 3,776,305 to Simmons. The device disclosed in the Simmons patent uses a liquid coolant circulated through cold plates to cool adjacent electronic devices. The subsequently heated liquid coolant is then circulated either to a cooling bath of a secondary liquid or to an air cooled heat exchange area. When cool air is unavailable and the coolant temperature is at its highest, the secondary liquid from the cooling bath undergoes a phase change from liquid to vapor and absorbs additional heat from the circulating coolant. The Simmons device is therefore relatively complex and bulky since it provides for two separate liquid media, two separate heat exchangers and a coolant circulator pump. Such large units are somewhat disadvantageous on aircraft where light weight and minaturization are of critical importance.

In view of the above it is an object of this invention to provide a light weight and compact heat transfer device capable of providing adequate cooling for heat dissipating components independent of the availability of cooling air.

SUMMARY OF THE INVENTION

The invention comprises a compact, light weight, dual mode heat transfer device. The dual mode heat transfer device provides for air cooling of heat dissipating electronic components at moderate aircraft speeds and when the available ambient air is below a preselected temperature. At elevated aircraft speeds and when the ambient air temperature is above the preselected temperature a coolant liquid is converted to steam or vapor in order to cool the heat dissipating electronic components.

A preferred embodiment of the invention includes a cold plate for conducting heat away from the heat dissipating components and radiator fins for dissipating cold plate heat to a cooling air flow. Additionally, a liquid coolant is provided in cavities formed in the cold plate immediately adjacent to the electronic components. This liquid coolant vaporizes at elevated temperatures, when the cooling air flow is unavailable, to cool the cold plate. The steam released by vaporization of the liquid coolant is exhausted from the dual mode heat transfer device through a hydrophobic filter membrane covering a portion of the cavities. The hydrophobic membrane is impervious to liquids but permeable to gas.

In the preferred embodiment of the invention the heat transfer device further comprises an air valve for selectively stopping air flow across the radiator fins when, for example, air flow temperature is too warm for useful cooling.

A further aspect of the preferred embodiment is the use of different liquid mixtures to establish a desired vaporization temperature for the liquid coolant. The invention may also comprise a liquid reservoir fluidly connected to the coolant cavities in the cold plate. The liquid reservoir serves to replenish the coolant liquid in the cavities as coolant is vaporized to absorb heat.

BRIEF DESCRIPTION OF THE DRAWINGS

The foregoing and other objects and advantages of the invention will be apparent from the following more particular description of the preferred embodiment of the invention, as illustrated in the accompanying drawings, in which like reference characters refer to the same parts throughout the different views. The drawings are not necessarily to scale, emphasis is instead being placed upon illustrating the principles of the invention.

DETAILED DESCRIPTION OF THE INVENTION

Figure 1:
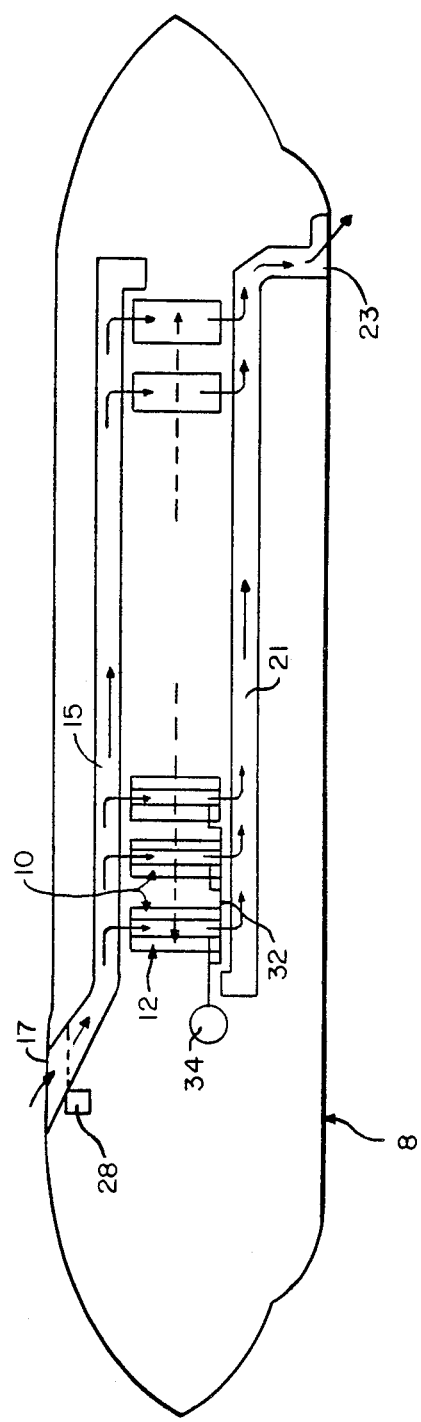
FIG. 1 is a schematic representation of an airborne electronic pod incorporating several dual mode heat transfer devices embodying the principles of the invention.

FIG. 1 is a schematic representation of an electronics pod 8 containing a dual mode heat transfer devices 10 which incorporate the invention. The dual mode heat transfer device 10 may be associated with an airborne electronics module 12 such as generally used on aircraft having sensitive radar or electronic counter-measure devices (ECM). The heat transfer devices and the electronics modules are fixedly mounted within the streamlined pod 8 which is attached underneath an aircraft wing or fuselage. A single pod may have a plurality of electronic devices 12 and associated heat transfer units 10. The mounting and arrangement of the heat transfer device 10 within such a pod is conventional except for the novel features described herein.

Figure 2:
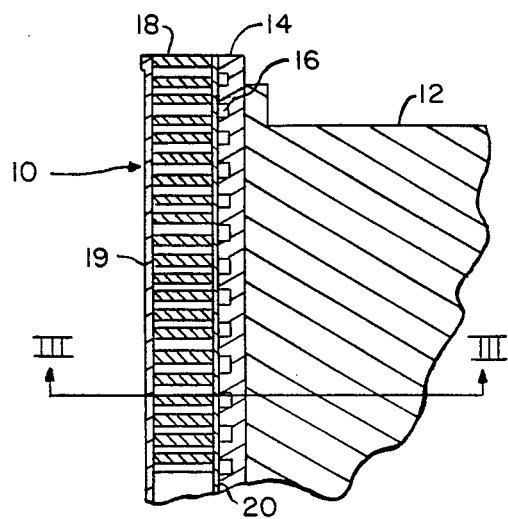
FIG. 2 is a cross-sectional view of a single dual mode heat transfer device embodying the principles of the invention.

FIG. 2 is a cross-sectional view of the dual mode heat transfer device which shows more of the details of the device. The dual mode heat exchanger 10 is thermally coupled to the electronics module 12 by means of a heat transfer plate, or cold plate 14. In practice, the cold plate can be made an integral part of the electronics module with electronic components mounted directly to preformed mounting surfaces on the cold plate.

The cold plate 14 is therefore directly coupled to the electronics module and is preferrably constructed of a thermally conductive metal such as aluminum. Grooves 16 are formed in the cold plate on a surface opposite the electronics module 12. These grooves are small enough not to substantially affect heat conduction to the cold plate 10 from the electronics module 12. The grooves 16 are used for evaporative cooling of the electronics module as described below.

Thermally coupled to, or forming a part of the cold plate 14 are radiator fins 18 which are used for air cooling. Heat is transferred to the fins by conduction from the electronic module 12 through the cold plate 14. When sufficient cool air is available, air from inlet 17 (FIG. 1) is routed through duct 15 to the heat transfer device and driven across the fins 18 in order to dissipate the heat from the electronics module. The air is confined to flow past the radiator fins 18 by an outer face sheet 19 and an inner face sheet 20. Heated air is then routed through exhaust duct 21 (FIG. 1) and expelled through exhaust port 23.

Air cooling represents the operative cooling mode of the dual mode heat transfer device for normal conventional flight. Under certain flight conditions, however, cool air may be unavailable, making it impossible to dissipate heat with air cooled fins. An example of such a flight condition is encountered during high speed dashes when the temperature of air flowing over the aircraft skin rises precipitously. Under such conditions an alternate method of cooling the electronics module is required.

Figure 4:
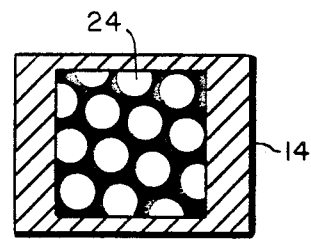
FIG. 4 is a sectional view of the dual mode heat transfer device taken across line 4—4 of FIG. 3 showing a hydrophobic membrane used for exhausting vapor from the device of FIG. 1.
Figure 3:
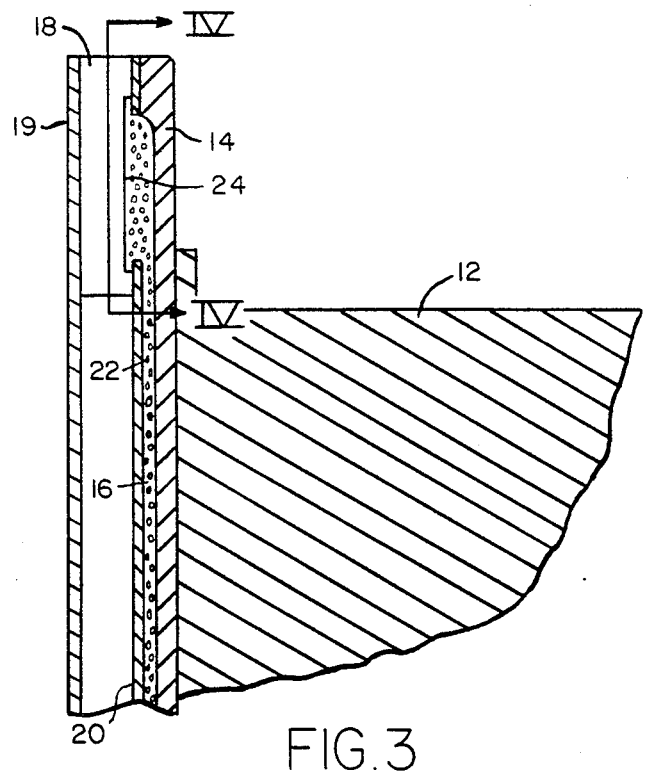
FIG. 3 is a cross-sectional view of the dual mode heat transfer device of FIG. 2 taken across line 3—3 of FIG. 2.

The second cooling mode for the dual mode heat transfer device 10 may be seen in more detail with reference to FIGS. 3 and 4. FIG. 3 is a cross-sectional view of the heat transfer device 10 taken across lines 3—3 of FIG. 2.

The cold plate grooves 16 are filled with a coolant liquid 22 which is confined by the inner face sheet 20, a membrane 24, and the cold plate 14. During the air cooled mode the coolant liquid plays a passive cooling role and serves to provide a valuable thermal inertia. This thermal inertia prevents rapid temperature shifts due to transient air temperature changes. During aircraft maneuvers or take off transient ingestion of hot engine air might otherwise damage electronic components or overstress electrical connections therebetween. Thus the liquid moderates the temperature shifts applied to the electronics module in a manner similar to the moderating effect of a lake upon nearby land.

The coolant liquid plays a more active role when cool air is unavailable. When cool air is unavailable and the cold plate temperature approaches the boiling point of the coolant liquid an air shut off valve 28 (FIG. 1) is activated thermostatically. Air flow across the radiator fins is thereby terminated so that hot air will not add to the heat load on the cold plate.

The coolant liquid boils, or evaporates, as the cold plate heats up in order to prevent a rise in cold plate (and electronic module) temperature beyond preselected temperatures. When a substance changes from a liquid to a vapor, energy is required to break the interatomic bonds that bind the substance's molecules into the liquid form. This energy is commonly referred to as the "latent heat of vaporization" since all substances remain at constant temperature as they absorb heat energy during their change of state. Therefore, during boiling the coolant liquid absorbs heat energy from the cold plate and thereby cools the cold plate and the electronics module. This method of cooling is called evaporative cooling.

Membrane 24 is a key element that allows this compact heat transfer device 10 to utilize evaporative cooling without the need of extensive piping, pumps or complex valves. Steam or vapor released by the boiling coolant liquid is automatically expelled through the membrane 24 to exhaust duct 21 while liquid is retained. This is possible because the membrane used is a selectively permeable hydrophobic filter of the type manufactured by Millipore Corporation of Bedford, Mass. Such membraneous filters are porous to vapors but will retain liquids regardless of aircraft attitude or acceleration. Filters of this type will not pass liquids even under a pressure of several hundred pounds per square inch (PSI).

The liquid coolant is therefore consumed during evaporative cooling, through the exhausting of vapor through the membrane. In order to replenish the liquid, supply grooves 16 are fluidly connected to a plenum 32 and a liquid reservoir 34 (shown schematically in FIG. 1). The plenum equalizes the refilling of the grooves from the liquid reservoir 34.

The total membrane area required for effective cooling depends on the amount of vapor which must be expelled, which in turn depends on the heat load on the cold plate. For example, a 1000 watt heat load produces 3.5 lbs/hr of aqueous (water) steam flow. This can be accomodated by a filter membrane area of about 78.5 square inches when the membrane is, for example, type F.G.L.P. manufactured by the Millipore Corporation.

The preselected maximum temperature, not to be exceeded during the evaporative cooling mode, is determined by the maximum electronics temperature to be allowed and is controlled by the temperature at which the coolant boils. This is possible because, as mentioned above, coolant temperature remains constant during vaporization. If water alone is used as the coolant liquid, a membrane pressure drop of 4.8 psi at sea level across a membrane area of about 78 square inches will result in a steam temperature of 108° C. The electronics module temperature would, however, be slightly higher due to heat losses across the cold plate.

A pressure drop at the filter is caused by the suction from a connected exterior port 23. The suction is caused by high speed air flow past the exterior ports of an aircraft body or pod in flight (i.e. high air speed, low air pressure). The coolant boiling temperature will therefore vary somewhat with aircraft speed and altitude. For example, at 40,000 feet altitude the same flow as above would produce a steam temperature of about 100° C. Different electronic module are able to withstand varying maximum temperatures. Therefore, by considering the flight envelope of the appropriate aircraft and the maximum possible coolant boiling temperature one is able to set the maximum electronic module temperature through proper choice of coolant and membrane area.

Another liquid that can be used as a coolant is methanol. Under the same conditions as stated above, methanol will boil at 70° C. at sea level and at about 64° C. at 40,000 feet altitude resulting in a cooler electronic module temperature then water coolant. A greater quantity of methanol must be used for cooling as compared with water since the onset or boiling occurs at a lower temperature and its latent heat of vaporization is less than half that of water (i.e., it absorbs less energy during its change of state).

Water and methanol are only two examples of a very large variety of liquids and liquid mixtures that can be used to set the maximum temperature to which the electronic module is to be subjected.

In addition to its use during boiling of the coolant liquid the hydrophobic membrane is also useful in purging the coolant system when filled. Any air trapped in the grooves when they are initially filled is expelled through the membrane. Therefore, the possibility of trapped air and resultant ineffective cooling is eliminated.

An additional advantage of this dual mode heat exchanger is that heat exchanger operation is unaffected by vehicle orientation or acceleration. This is because both cooling modes are essentially passive without valves or pump to malfunction or stall.

Thus it has been shown how this invention utilizes evaporative cooling in a efficient straightforward manner. Through the use of this dual mode heat exchanger reliable cooling can be provided for airborne electronics throughout an aircraft's flight envelope.

While the invention has been particularly described with reference to the preferred embodiment thereof, it will be understood by those skilled in the art that various changes in form and detail may be made therein without departing from the spirit and scope of the invention described in the appended claims.

I claim:

1. A device for cooling heat dissipating electronic components comprising:
    (a) a heat transfer plate thermally coupled to said electronic components for absorbing heat generated by said electronic components;
    (b) radiation fins thermally coupled to said heat transfer plate, for radiating heat absorbed by said heat transfer plate from said electronic components to a gaseous medium;
    (c) a liquid medium for evaporative cooling of said electronic components; and
    (d) a cavity formed to retain said liquid medium operably associated with said heat transfer plate; and
    (e) a selectively permeable membrane in contact with said liquid medium which retains said liquid medium within said cavity but permits vapor to leave said cavity in order to encourage evaporative cooling.

2. The device defined in claim 1 further comprising a valve for controlling the passage of said gaseous medium past said radiation fins.

3. The device defined in claim 2 wherein said valve is thermostatically controlled.

4. The device defined in claim 1 wherein said liquid medium comprises water.

5. The device defined in claim 1 wherein said liquid medium comprises methanol.

6. The device defined in claim 1 wherein said cavity is fluidly connected to a liquid resevoir which serves to replenish the liquid medium in said cavity.

7. The device defined in claim 1 wherein said cavity comprises grooves formed on a face of said heat transfer plate, said grooves being fluidly connected with each other and said selectively permeable membrane.

8. The device defined in claim 1 wherein said device is mounted for exposure to an air stream surrounding an aircraft.

9. The device defined in claim 1 wherein said cavity is positioned adjacent to said heat transfer plate and said radiation fins.

10. A dual mode heat transfer device for cooling heat dissipating components comprising:
    (a) a cold plate for absorbing heat from and thereby cooling said heat dissipating components;
    (b) radiator fins for radiating heat conducted through said cold plate to an air flow adjacent to said radiator fins;
    (c) an aqueous coolant liquid disposed in grooves formed in said cold plate so that at elevated temperatures said coolant liquid is converted to vapor in order to cool said cold plate; and,
    (d) a hydrophobic membrane adjacent to said coolant liquid which allows vapor to vent from said grooves.

11. The dual mode heat transfer device claimed in claim 10 wherein said coolant liquid comprises water.

12. The dual mode heat transfer device claimed in claim 10 wherein said coolant liquid comprises methanol.

13. The dual mode device of claim 10 further comprising an air valve for selectively stopping air flow across said radiator fins.

* * * * *